US012593685B2

(12) United States Patent
Choi et al.

(10) Patent No.: US 12,593,685 B2
(45) Date of Patent: Mar. 31, 2026

(54) SEMICONDUCTOR PACKAGE

(71) Applicant: SAMSUNG ELECTRONICS CO., LTD., Suwon-si (KR)

(72) Inventors: Jaehoon Choi, Suwon-si (KR); Sayoon Kang, Suwon-si (KR); Taewook Kim, Suwon-si (KR); Hwasub Oh, Suwon-si (JP); Jooyoung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 532 days.

(21) Appl. No.: 18/140,907

(22) Filed: Apr. 28, 2023

(65) Prior Publication Data

US 2023/0268241 A1      Aug. 24, 2023

Related U.S. Application Data

(63) Continuation of application No. 16/720,131, filed on Dec. 19, 2019, now Pat. No. 11,646,241.

(51) Int. Cl.
*H01L 23/13* (2006.01)
*H01L 23/00* (2006.01)
(Continued)

(52) U.S. Cl.
CPC .............. *H01L 23/34* (2013.01); *H01L 23/28* (2013.01); *H01L 23/4952* (2013.01);
(Continued)

(58) Field of Classification Search
CPC ..... H01L 23/34; H01L 23/28; H01L 23/4952; H01L 23/49541; H01L 23/49568;
(Continued)

(56) References Cited

U.S. PATENT DOCUMENTS 9,978,731 B1      5/2018 Kim
2012/0187555 A1      7/2012 Ong et al.
(Continued)

FOREIGN PATENT DOCUMENTS

CN      105977219 A      9/2016
CN      106486383 A      3/2017
CN      108257926 A      7/2018

OTHER PUBLICATIONS

Office Action dated Feb. 18, 2025, issued by Chinese Patent Office in Chinese Patent Application No. 202010115046.3.
(Continued)

*Primary Examiner* — Brent A. Fairbanks
*Assistant Examiner* — Daniel J Hibbert
(74) *Attorney, Agent, or Firm* — Sughrue Mion, PLLC

(57)      ABSTRACT

A semiconductor package includes a connection structure having first and second surfaces opposing each other and including a first redistribution layer; a semiconductor chip disposed on the first surface of the connection structure and including connection pads connected to the first redistribution layer; an encapsulant disposed on the first surface of the connection structure and encapsulating the semiconductor chip; and a second redistribution layer disposed on the encapsulant; a wiring structure connecting the first and second redistribution layers to each other and extending in a stacking direction; and a heat dissipation element disposed on at least a portion of the second surface of the connection structure.

20 Claims, 17 Drawing Sheets

100A 191      195A
185
140B
110B
140A
141
142
143
112a
13a
111a
110A
112b ⎱110
13b
11b
153 152
155
160 120 120P 130
170
180
112c 141
142 ⎱140
143 ⎱145

(51) Int. Cl.

| | |
|---|---|
| *H01L 23/28* | (2006.01) |
| *H01L 23/31* | (2006.01) |
| *H01L 23/34* | (2006.01) |
| *H01L 23/367* | (2006.01) |
| *H01L 23/495* | (2006.01) |
| *H01L 23/525* | (2006.01) |
| *H01L 23/528* | (2006.01) |
| *H01L 23/538* | (2006.01) |
| *H01L 25/065* | (2023.01) |
| *H01L 23/50* | (2006.01) |

(52) U.S. Cl.
CPC .. *H01L 23/49541* (2013.01); *H01L 23/49568* (2013.01); *H01L 23/49575* (2013.01); *H01L 23/5384* (2013.01); *H01L 24/14* (2013.01); *H01L 25/0657* (2013.01)

(58) Field of Classification Search
CPC ........... H01L 23/49575; H01L 23/5384; H01L 24/14; H01L 25/0657; H01L 24/19; H01L 2224/04105; H01L 23/5385; H01L 23/5389; H01L 23/3677; H01L 23/5383; H01L 23/49811; H01L 23/13; H01L 23/3128; H01L 23/50; H01L 23/49816; H01L 23/367; H01L 23/49838; H01L 23/31; H01L 23/5226; H01L 23/525; H01L 23/528; H01L 24/06; H01L 2224/02379
See application file for complete search history.

(56) References Cited

U.S. PATENT DOCUMENTS

| | | | |
|---|---|---|---|
| 2014/0110840 | A1 | 4/2014 | Wojnowski et al. |
| 2014/0252645 | A1 | 9/2014 | Kim et al. |
| 2017/0062383 | A1 | 3/2017 | Yee |
| 2017/0062394 | A1 | 3/2017 | Lin et al. |
| 2018/0005984 | A1 | 1/2018 | Yu |
| 2018/0082933 | A1 | 3/2018 | Ko |
| 2018/0096927 | A1 | 4/2018 | Kim et al. |
| 2018/0138029 | A1 | 5/2018 | Kim et al. |
| 2018/0337148 | A1 | 11/2018 | Baek |
| 2019/0019757 | A1 | 1/2019 | Lee et al. |
| 2019/0057944 | A1 | 2/2019 | So et al. |
| 2019/0348371 | A1 | 11/2019 | Fang |
| 2020/0161206 | A1 | 5/2020 | Hu |
| 2020/0185304 | A1 | 6/2020 | Chiu |
| 2020/0203283 | A1 | 6/2020 | Lee |
| 2020/0251414 | A1 | 8/2020 | Hsu |
| 2020/0303314 | A1 | 9/2020 | Kang |
| 2020/0335469 | A1 | 10/2020 | Kim |
| 2021/0005532 | A1 | 1/2021 | Kwon |
| 2021/0118765 | A1 | 4/2021 | Kang |
| 2021/0125961 | A1 | 4/2021 | Tsai |
| 2021/0288000 | A1 | 9/2021 | Heo |

OTHER PUBLICATIONS

Communication dated Aug. 1, 2023 issued by the Korean Intellectual Property Office in Korean Application No. 10-2019-0022542.

I-I'

SEMICONDUCTOR PACKAGE

CROSS-REFERENCE TO RELATED APPLICATIONS

This application is a continuation of U.S. application Ser. No. 16/720,131, filed Dec. 19, 2019, which claims the benefit of priority to Korean Patent Application No. 10-2019-0022542 filed on Feb. 26, 2019 in the Korean Intellectual Property Office, the disclosure of which is incorporated herein by reference in its entirety.

TECHNICAL FIELD

The present disclosure relates to a semiconductor package.

BACKGROUND

A significant recent trend in the development of technology related to semiconductor chips has been reductions in the size of components used in semiconductor chips. Therefore, in the field of package technology, in accordance with a rapid increase in demand for small-sized semiconductor chips, there has been increasing demand for a semiconductor package having a compact size while being capable of implementing a large amount of pins.

One type of packaging technology suggested to satisfy the technical demand as described above may be a fan-out semiconductor package. Such a fan-out semiconductor package is compact in size and may allow a large amount of pins to be implemented by redistributing connection terminals up to a region outside a region overlapping a semiconductor chip. Furthermore, semiconductor package has been recently required to improve heat dissipation characteristics.

SUMMARY

An aspect of the present disclosure may provide a semiconductor package having improved heat dissipation characteristics.

According to an aspect of the present disclosure, a semiconductor package may include: a connection structure having first and second surfaces opposing each other and including a first redistribution layer; a semiconductor chip disposed on the first surface of the connection structure and including connection pads connected to the first redistribution layer; an encapsulant disposed on the first surface of the connection structure and covering the semiconductor chip; a second redistribution layer disposed on the encapsulant; a wiring structure connecting the first and second redistribution layers to each other and extending in a stacking direction; and a heat dissipation element disposed on at least a portion of the second surface of the connection structure.

According to another aspect of the present disclosure, a semiconductor package may include: a frame having first and second surfaces opposing each other and including a through-hole passing through the first and second surfaces and a wiring structure connecting the first and second surfaces to each other; a connection structure disposed on the first surface of the frame and including a first redistribution layer connected to the wiring structure; a semiconductor chip disposed in the through-hole on the connection structure and including connection pads connected to the redistribution layer; an encapsulant encapsulating the semiconductor chip disposed in the through-hole; a second redistribution layer disposed on the second surface of the frame and connected to the wiring structure; and a heat dissipation element disposed on at least a portion of the connection structure.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings. In the accompanying drawings, shapes, sizes, and the like, of components may be exaggerated or simplified for clarity.

Electronic Device

Figure 1:
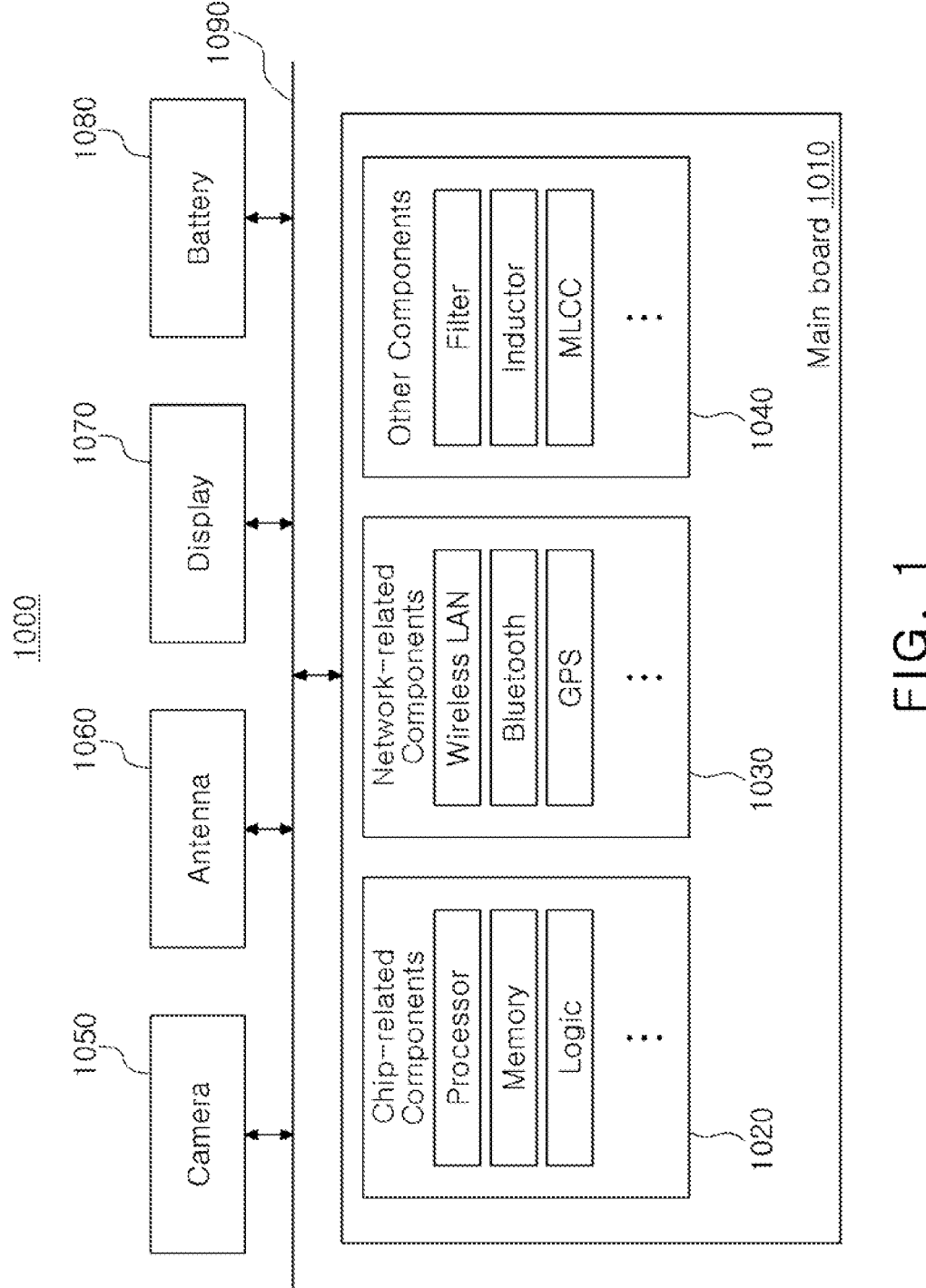
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to other components, to be described below, to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include components implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
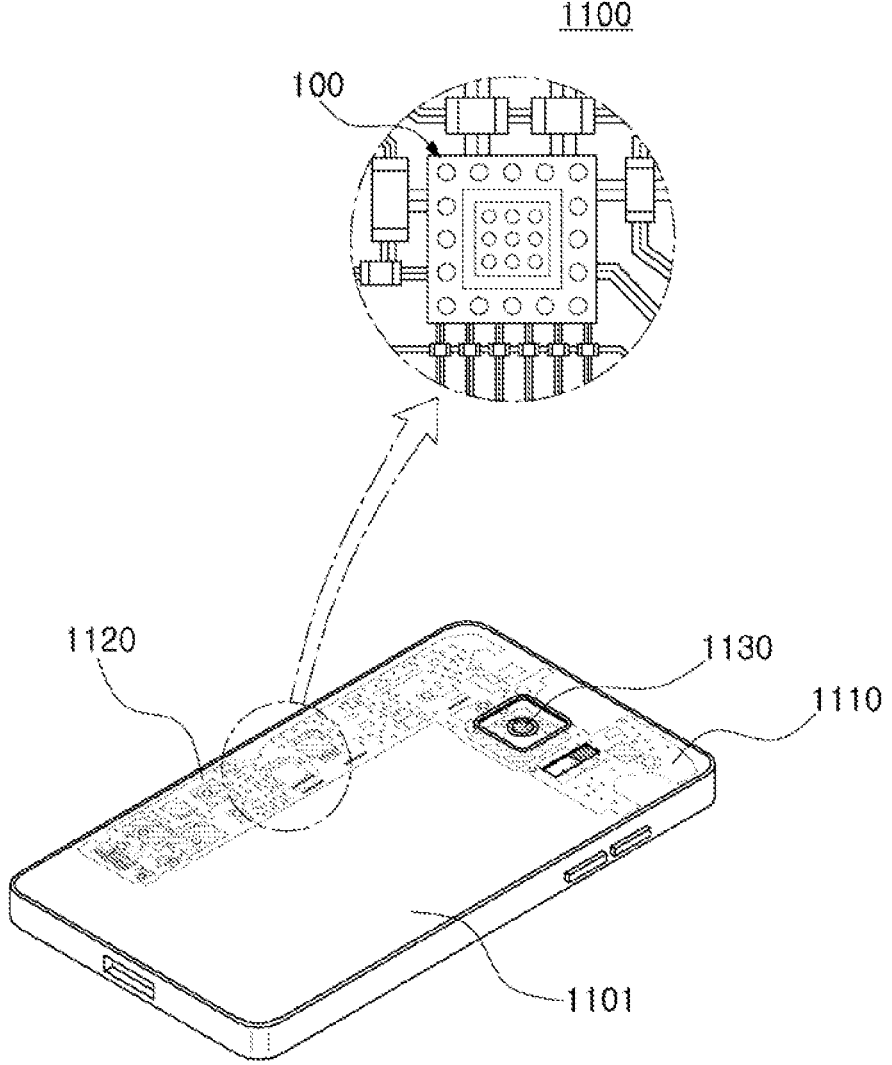
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the main board 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in itself and may be damaged due to external physical or chemical impact. Therefore, the semiconductor chip may not be used by itself, but is instead packaged and used in an electronic device or the like in a package state.

The reason why semiconductor packaging is commonly used is that there is generally a difference in a circuit width between the semiconductor chip and a main board of the electronic device in terms of electrical connection. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board and use of packaging technology for buffering a difference in a circuit width between the semiconductor and the main board is thus advantageous.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figures 3A, 3B:
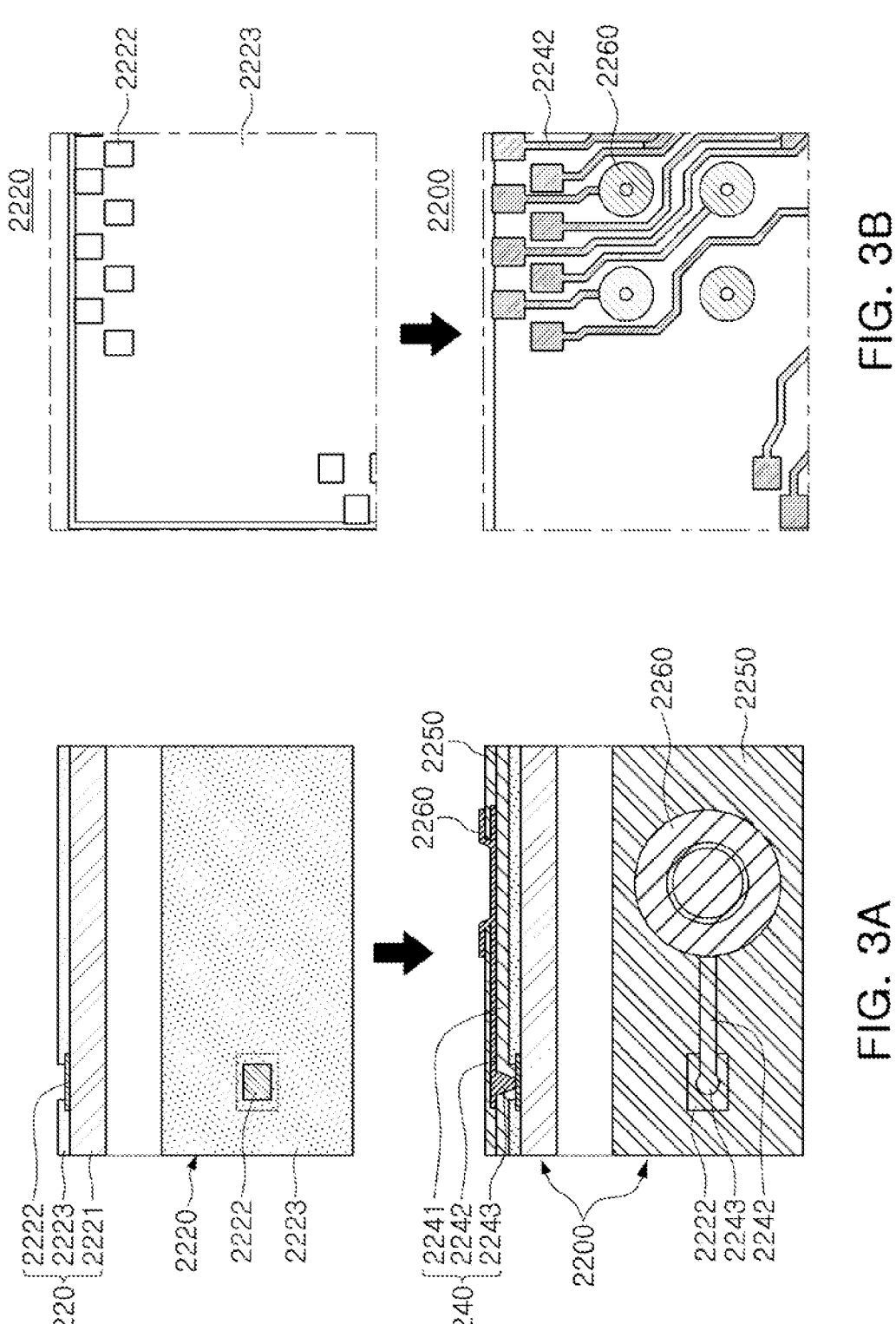
FIGS. 3A and 3B are schematic cross-sectional views illustrating a fan-in semiconductor package before and after being packaged.
Figure 4:
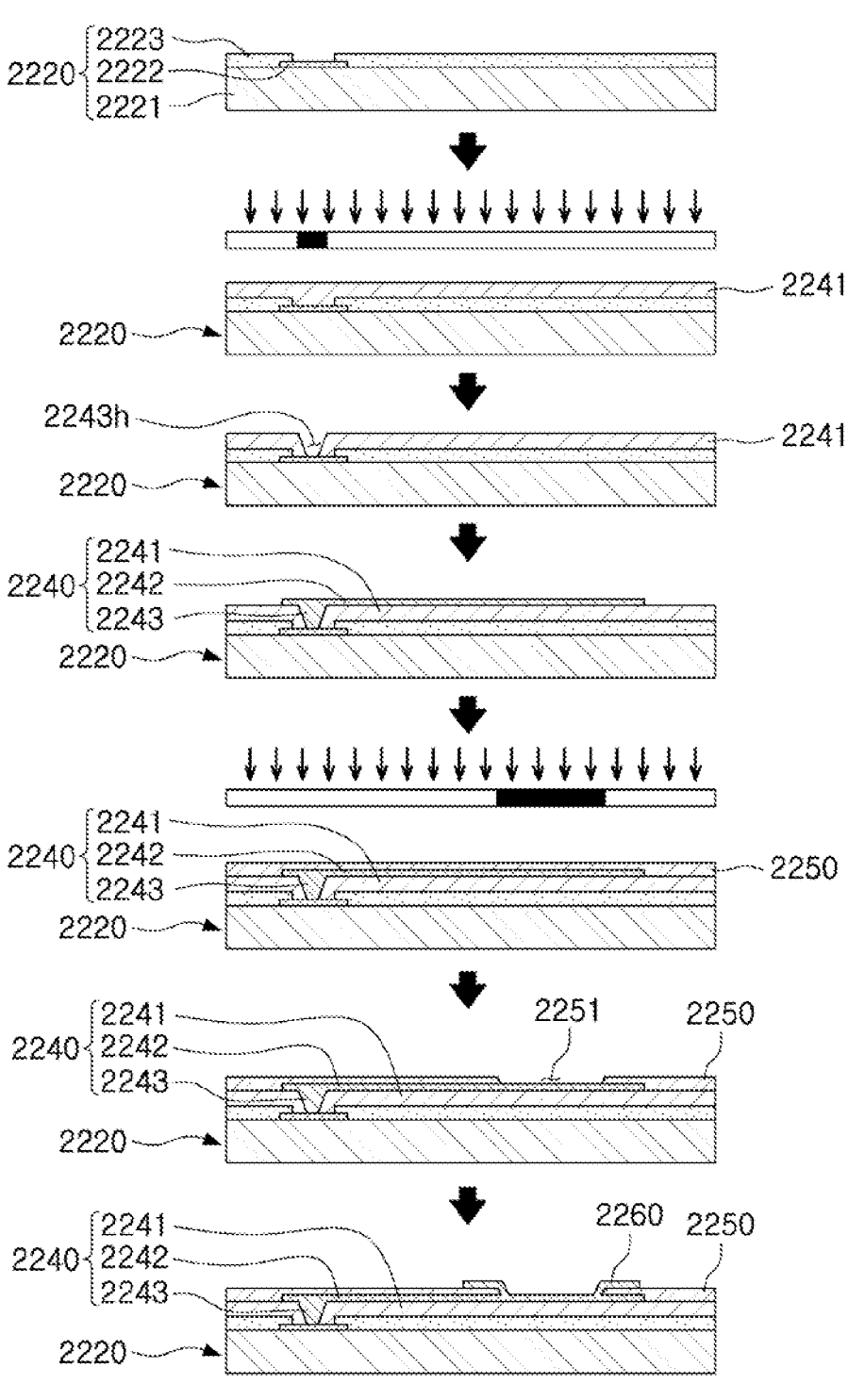
FIG. 4 shows a series of schematic cross-sectional views illustrating a packaging process of a fan-in semiconductor package.

FIGS. 3A and 3B are schematic cross-sectional views illustrating a fan-in semiconductor package before and after being packaged, and FIG. 4 shows a series of schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening on to the connection pads 2222, and then forming wiring patterns 2242 and vias 2243. Then, a passivation layer 2250 protecting the connection member 2240 may be formed, and an opening 2251 may be formed to have an underbump metal layer 2260, or the like, extending therethrough. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals generally need to be disposed inside the semiconductor chip in the fan-in semiconductor package, the fan-in semiconductor package has a large spatial limitation. Therefore, it may be difficult to apply this structure to a semiconductor chip having a large number of I/O terminals or a semiconductor chip having a small size. In addition, due to the disadvantages described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
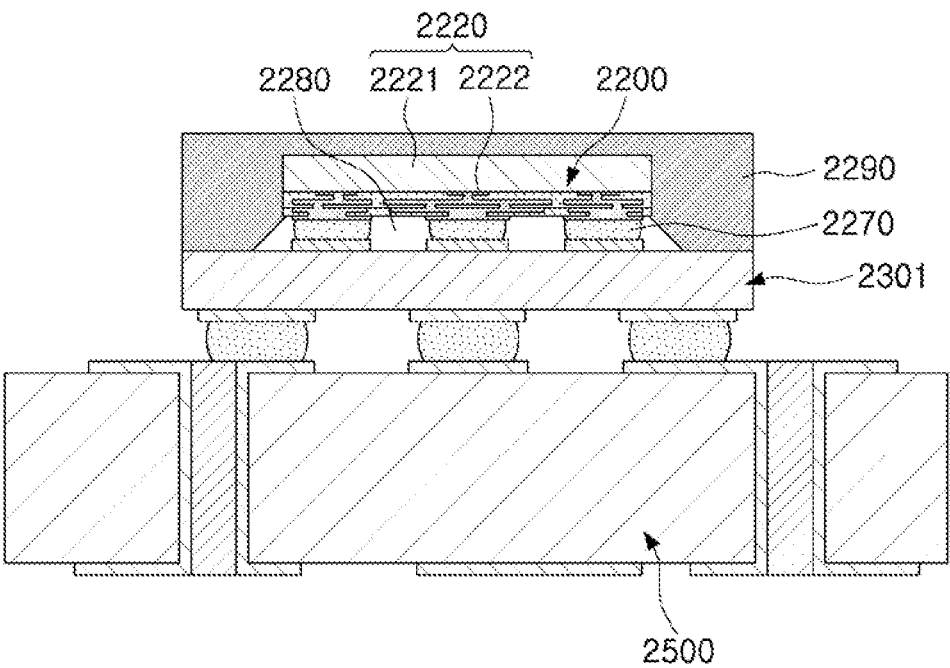
FIG. 5 is a schematic cross-sectional view illustrating a fan-in semiconductor package mounted on an interposer substrate that is ultimately mounted on a main board of an electronic device.
Figure 6:
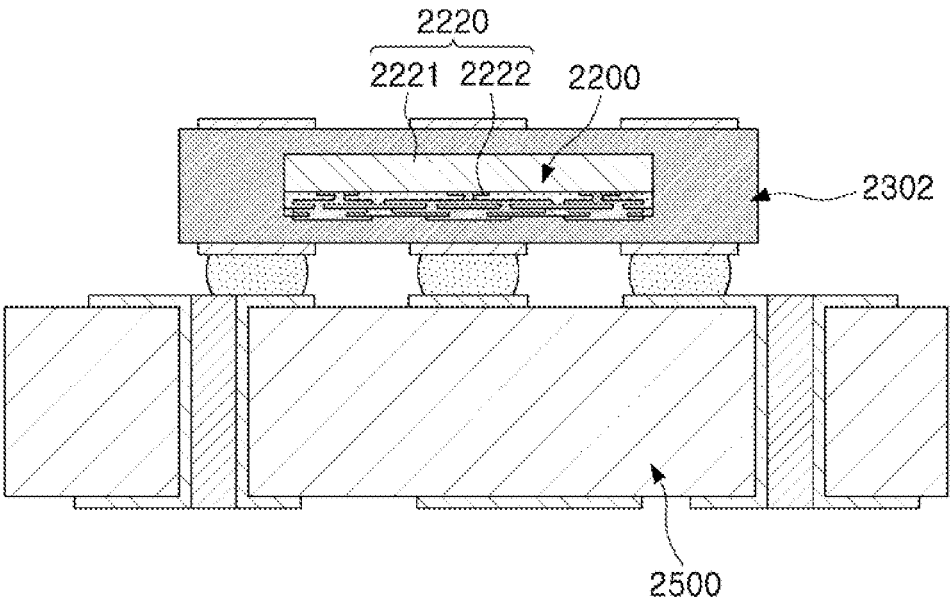
FIG. 6 is a schematic cross-sectional view illustrating a fan-in semiconductor package embedded in an interposer substrate that is ultimately mounted on a main board of an electronic device.

FIG. 5 is a schematic cross-sectional view illustrating a fan-in semiconductor package mounted on an interposer substrate that is ultimately mounted on a main board of an electronic device, and FIG. 6 is a schematic cross-sectional view illustrating a fan-in semiconductor package embedded in an interposer substrate that is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board (e.g., 2500) of the electronic device. Therefore, the fan-in semiconductor package may be mounted on the separate interposer substrate (e.g., 2301 or 2302) and be then mounted on the main board of the electronic device through a packaging process or may be mounted and used on the main board of the electronic device in a state in which it is embedded in the interposer substrate.

Fan-Out Semiconductor Package

Figure 7:
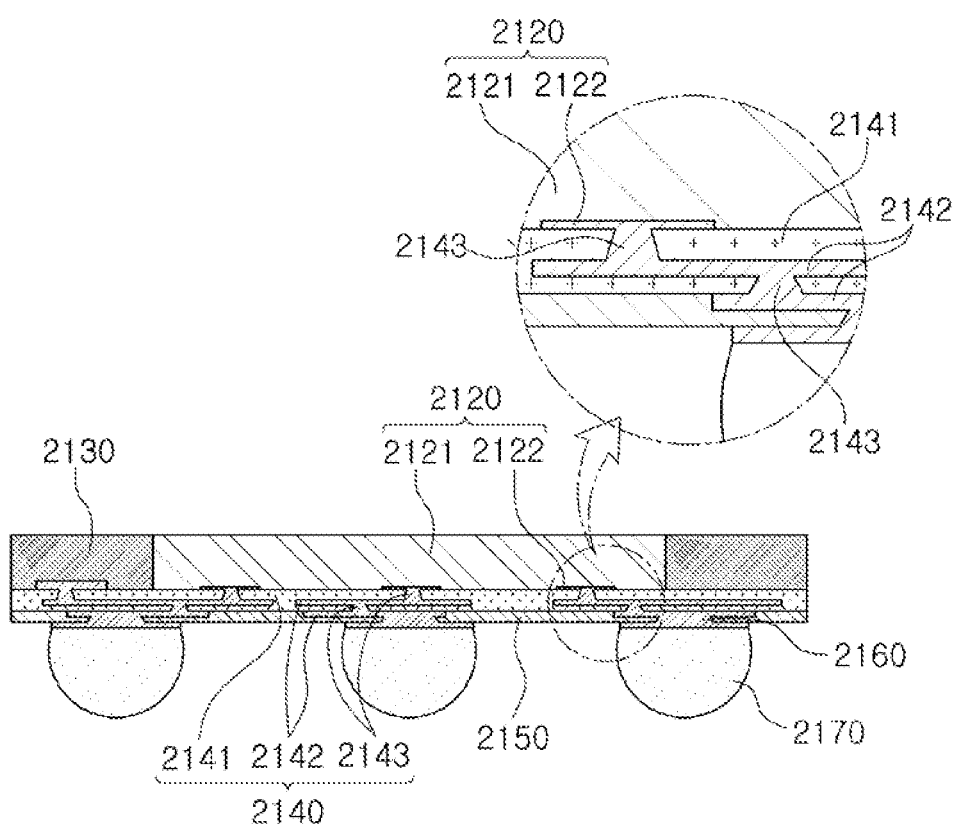
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for forming the connection member 2140 is performed to form the via(s) connecting the redistribution layers and the connection pads 2122 of the semiconductor chip 2120 to each other and the redistribution layers 2142, and the vias 2143 may thus have a width reduced toward the semiconductor chip 2120 (see an enlarged region).

As described above, the fan-out semiconductor package may have a form in which I/O terminals of the semiconductor chip are redistributed and disposed outwardly of the semiconductor chip 2120 through the connection member 2140 formed on the semiconductor chip 2120. As described above, in the fan-in semiconductor package, all I/O terminals of the semiconductor chip generally need to be disposed inside the semiconductor chip (e.g., within the footprint of the semiconductor chip on the package). Therefore, when a size of the semiconductor chip is decreased, a size and a pitch of balls generally need to be decreased, such that a standardized ball layout may not be used in the fan-in semiconductor package. On the other hand, the fan-out semiconductor package has the form in which the I/O terminals of the semiconductor chip 2120 are redistributed and disposed outwardly of the semiconductor chip 2120 (e.g., outwardly from the footprint of the semiconductor chip) through the connection member 2140 formed on the semiconductor chip as described above. Therefore, even in the case that a size of the semiconductor chip 2120 is decreased, a standardized ball layout may be used in the fan-out semiconductor package as it is, such that the fan-out semiconductor package may be mounted on the main board of the electronic device without using a separate interposer substrate, as described below.

Figure 8:
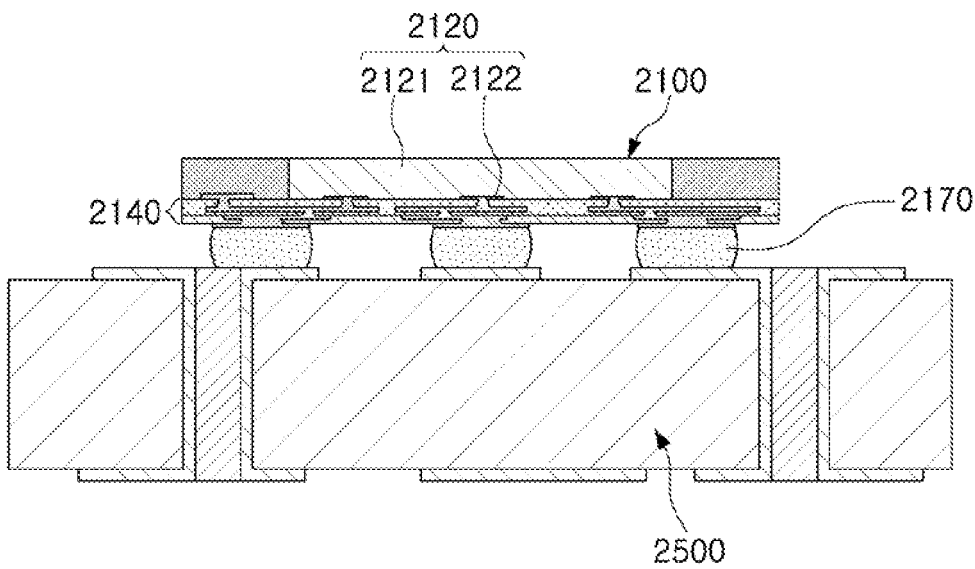
FIG. 8 is a schematic cross-sectional view illustrating a fan-out semiconductor package mounted on a main board of an electronic device.

FIG. 8 is a schematic cross-sectional view illustrating a fan-out semiconductor package mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of an area/footprint of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB) and may solve a problem caused by the occurrence of a warpage phenomenon.

Meanwhile, the fan-out semiconductor package refers to a packaging technology for mounting the semiconductor chip on the main board of the electronic device, or the like, as described above, and protecting the semiconductor chip from external impacts. The fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
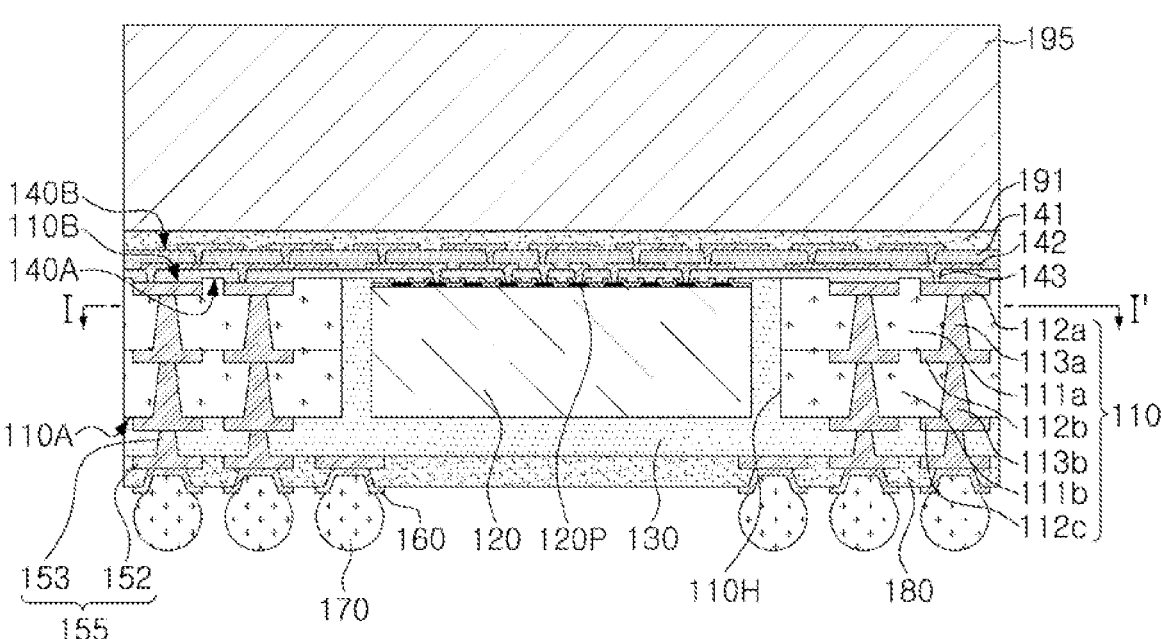
FIG. 9 is a schematic cross-sectional view illustrating a semiconductor package according an example embodiment of the present disclosure.
Figure 10:
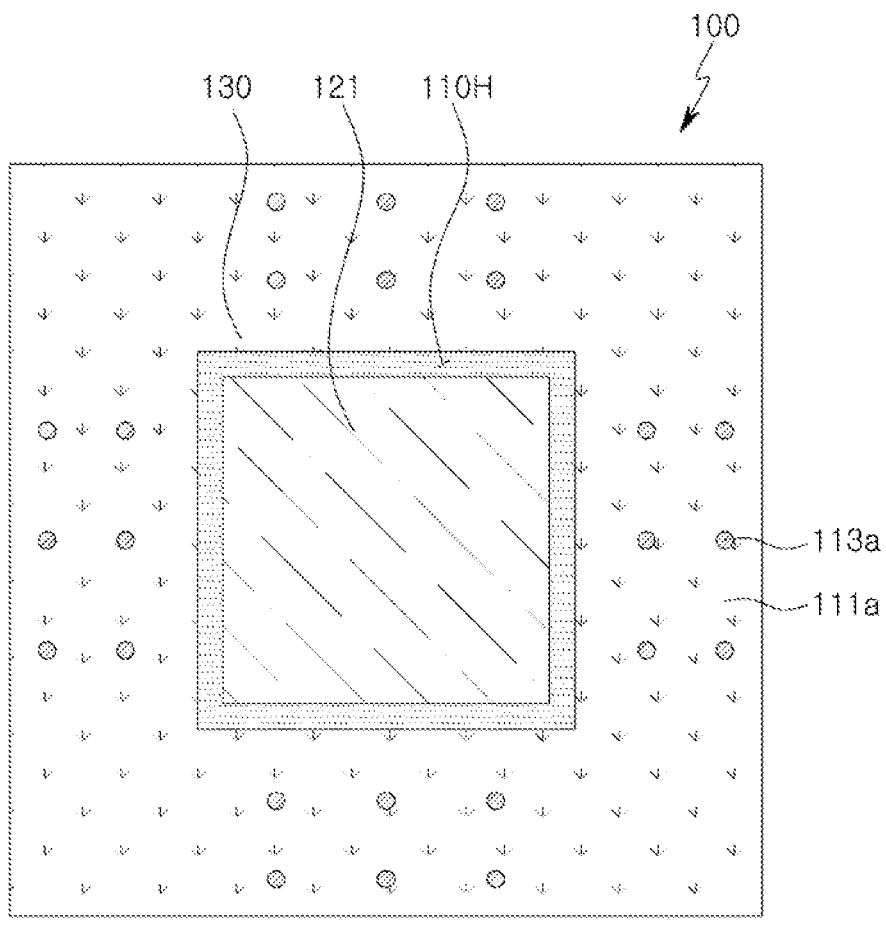
FIG. 10 is a plan view taken along line I-I' of the semiconductor package of FIG. 9.

FIG. 9 is a schematic cross-sectional view of a semiconductor package according to an example embodiment, and FIG. 10 is a plan view taken along line I-I' of the semiconductor package of FIG. 9.

Referring to FIG. 9 and FIG. 10, a semiconductor package 100 according to the present example embodiment includes a connection structure 140 having a first surface 140A and a second surface 140B opposing each other, a semiconductor chip 120 disposed on the first surface 140A of the connection structure 140, and an encapsulant 130 disposed on the first surface 140A of the connection structure 140 and encapsulating the semiconductor chip 120.

The connection structure 140 employed in the present example embodiment includes a plurality (for example, at least two) of insulating layers 141 and a first redistribution layer 145 including two layers, and the connection pad 122 of the semiconductor chip 120 may be connected to a first redistribution layer 145.

The semiconductor package 100, as illustrated in FIG. 9, includes a frame 110 having a first surface 110A and a second surface 110B opposing each other, and a second redistribution layer 155 disposed on the first surface 110A of the frame 110.

The frame 110 may be disposed on the first surface 140A of the connection structure 140 and include a cavity 110H accommodating the semiconductor chip 120 therein. The frame 110 includes a wiring structure connecting an upper surface and a lower surface of the frame 110 with each other. The wiring structure employed in the present example embodiment may include three layers of wiring patterns 112a, 112b, and 112c, and first and second wiring vias 113a and 113b connecting the wiring patterns 112a, 112b, and 112c to each other, but is not limited thereto. The wiring structure may include a different number of layers or may be formed in a different structure in another embodiment (see FIG. 16). The wiring structure (the first wiring pattern 112a, in particular) of the frame 110 may be connected to redistribution layers 142 of the connection structure 140.

In this example embodiment, the encapsulant 130 extends to cover the upper surface of the frame 110. The second redistribution layer 155 may be disposed on the encapsulant 130 and electrically connected to the wiring structure (the third wiring pattern 112c, in particular). The second redistribution layer 155 may pass through a redistribution pattern 152 and an extended portion of the encapsulant 130 and include a wiring via 133 connected to the third wiring pattern 112c.

A heat dissipation system employed in the present example embodiment may include a heat dissipation element 195 disposed on the second surface 140B of the connection structure 140. The heat dissipation element 195 may be bonded to the connection structure 140 by using an adhesive layer 191. For example, the adhesive layer 191 may include a thermal interface material (TIM). If the adhesive layer 191 has electrical conductivity, there may be an additional insulating layer (for example, a passivation layer) on the connection structure 140.

Since the active surface of the semiconductor chip 120 (a surface of the semiconductor chip 120 on which the connection pads 120P are disposed) acts as a heat source, the heat dissipation element 195 may be disposed on the connection structure 140 as illustrated in the present example embodiment, to reduce the distance to the active surface of the semiconductor chip 120, thereby dramatically improving heat dissipation effects. Although the connection structure 140 is positioned between the semiconductor chip 120 and the heat dissipation element 195, the connection structure 140, due to including the first redistribution layer 145, which is relatively thin and formed of a highly thermally conductive metal (for example, Cu), is not likely to hinder the heat dissipation.

As illustrated in FIG. 9 and FIG. 10, the heat dissipation element 195 may have a surface area that corresponds to a surface area of the connection structure 140. For example, the heat dissipation element 195 may be disposed to cover substantially an entire surface area of the second surface 140B of the connection structure 140, but is not limited thereto. For example, the heat dissipation element 140 may be disposed to cover only a portion of the second surface 140B of the connection structure 140, and in this case, the rest of the second surface 140B may be provided as an area for mounting surface-mount components, such as passive components (see FIG. 12 and FIG. 14).

Hereinbelow, main components of the semiconductor package 100 according to the present example embodiment will be described in greater detail.

Depending on the material of which it is formed, the frame 110 may serve to further enhance rigidity of the semiconductor package 100 and may also play other roles such as ensuring a uniform thickness of the encapsulant 130. The semiconductor chip 120 disposed within the cavity 110H of the frame 110 may be spaced apart from an inner sidewall of the frame 110 by a predetermined distance. The frame 110 may be disposed so as to surround side surfaces of the semiconductor chip 120. However, the frame 110 is not limited thereto and may be variously modified in other forms to serve other functions.

The frame 110 includes a first insulating layer 111a contiguous to the connection structure 140, a first wiring pattern 112a contiguous to the connection structure 140 and buried in the first insulating layer 111a, a second wiring pattern 112b disposed on the other surface of the first insulating layer 111a opposing one surface of the first insulating layer 111a in which the first wiring pattern 112a is buried, a second insulating layer 111b disposed on the first insulating layer 111a and covering the second wiring pattern 112b, and a third wiring pattern 112c disposed on the second insulating layer 111b. The first to three wiring patterns 112, 112b, and 112c are electrically connected to each other through the first and second wiring vias 113a and 113b each passing through the first and second insulating layers 111a and 111b. The first and third wiring patterns 112a and 112c may be electrically connected to the first and second redistribution layers 145 and 155, respectively.

When the first wiring pattern 112a is buried in the first insulating layer 111a as in the present example embodiment, a step formed due to a thickness of the first wiring pattern 112a can be significantly reduced, and an insulating distance of the connection structure 140 may thus become more uniform. The first wiring pattern 112a may be recessed into the first insulating layer 111a, such that a lower surface of the first insulating layer 111a and a lower surface of the first wiring pattern 112a may have a step formed therebetween. In this case, such a step can serve to prevent the material of the encapsulant 130 from bleeding out to contaminate the first wiring pattern 112a. Since the connection structure 140 is fabricated to a small thickness by a semiconductor process or the like, whereas the frame 110 can be manufactured by a substrate process to a sufficient thickness, a thickness of each of the first to third wiring patterns 112a, 112b, and 112c of the frame 110 may be greater than a thickness of each of the redistribution layers 142 of the connection structure 140.

For example, the first and second insulating layers 111a and 111b may be formed using thermosetting resin such as epoxy resin, thermoplastic resin such as polyimide, or resin in which the thermosetting resin or the thermoplastic resin is mixed with inorganic filler or is impregnated together with inorganic filler in a core material such as glass fiber, glass cloth, and glass fabric, e.g., prepreg, Ajinomoto build-up film (ABF), FR-4, and bismaleimide triazine (BT). Alternatively, in some example embodiments, a photo-imageable dielectric (PID) resin may be used for the first and second insulating layers 111a and 111b. In terms of maintaining rigidity, prepreg may be preferably used for the first and second insulating layers 111a and 111b.

The first, second, and third wiring patterns 112a, 112b, and 112c may serve to redistribute the connection pads 122 of the semiconductor chip 120. The first, second, and third wiring patterns 112a, 112b, and 112c may contain a conductive material such as copper (Cu), aluminum (Al), silver (Ag), tin (Sn), gold (Au), nickel (Ni), lead (Pb), and titanium (Ti), or an alloy thereof. The first, second, and third wiring patterns 112a, 112b, and 112c may serve various functions depending on the design of a corresponding layer. For example, each of the first, second, and third wiring patterns 112a, 112b, and 112c may include ground (GrouND: GND) patterns, power (PoWeR: PWR) patterns, signal (Signal: S) patterns, or the like. In particular, the S pattern includes various signals except for the GND patterns, the PWR patterns, and the like, such as data signals. In addition, the first, second, and third wiring patterns 112a, 112b, and 112c may include via pads, wire pads, ball pads, or the like.

The first and second wiring vias 113a and 113b may electrically connect first to third wiring patterns 112a, 112b, and 112c formed on different insulating layers 111a and 111b to each other to form a wiring structure having an interlayer connection path within the frame 110. The first and second wiring vias 113a and 113b may be formed using at least one of the aforementioned conductive materials. Each of the first and second wiring vias 113a and 113b may be a filled-type via filled with a conductive material, or a conformal-type via in which a conductive material is formed along an inner wall of each of via holes. Also, depending on the process, the first and second wiring vias 113a and 113b may have tapered shapes with the same tapering direction with each other, that is, tapered shapes of which widths of upper portions are greater than those of lower portions when viewed in cross-section. When formed by the same plating process, the first and second wiring vias 113a and 113b may be integrated with the second and third wiring patterns 112b and 112c, respectively.

The semiconductor chip 120 may be an integrated circuit (IC) in which several hundreds to several millions of components are integrated in a single chip. For example, the IC may be a processor chip such as a central processor (for example, CPU), a graphic processor (for example, GPU), a field-programmable gate array (FPGA), a digital signal processor, an encryption processor, a microprocessor, a microcontroller, and the like. More specifically, the semiconductor chip 120 may be an application processor (AP) but is not limited thereto. The semiconductor chip 120 may be a memory chip such as a volatile memory (for example, DRAM), a non-volatile memory (for example, ROM), a flash memory, and the like; a logic chip such as an analog-digital converter, an application-specific IC (ASIC), and the like; or a chip of other types, such as a power management IC (PMIC), or a combination thereof may be used for the semiconductor chip 120.

The semiconductor chip 120 may be formed using an active wafer, and in this case, silicon (Si), germanium (Ge), gallium arsenic (GaAs), or the like may be used as the base material for forming a body portion 121. The body portion 121 may have various circuits formed therein. The connection pad 120P is for electrically connecting the semiconductor chip 120 to other components, and may be formed of a conductive material, such as aluminum (Al) and copper (Cu), without being limited thereto. A passivation layer opening the connection pad 120P may be formed on an active surface of the body portion. The passivation layer may be an oxide layer, a nitride layer, or the like, or may have a dual layer including both an oxide layer and a nitride layer. Due to a thickness of the passivation layer, a lower surface of the connection pad 120P may have a step with respect to a lower surface of the encapsulant 130, and accordingly, the encapsulant 130 may fill at least portions of a space between the passivation layer and the connection structure 140. In this case, the encapsulant 130 can be prevented, to an extent, from bleeding out to a lower surface of the connection pad 120P. Insulating layers (not illustrated) may be further disposed on other suitable areas. Since the semiconductor chip 120 may be a bare die, the connection pad 120P may be in physical contact with the redistribution vias 143 of the connection structure 140. Depending on the type of the semiconductor chip 120, there may be an additional redistribution layer (not illustrated) on the active surface of the semiconductor chip 120, and the semiconductor chip 120 may have a structure in which bumps (not illustrated) or the like are connected to the connection pad 120P.

The encapsulant 130 may serve to protect the frame 110, the first semiconductor chip 120, and the like. An encapsulation form of the encapsulant 130 is not limited to any particular form as long as it surrounds at least portions of each of the frame 110 and the semiconductor chip 120. For example, the encapsulant 130 may cover the frame 110 and an inactive surface (the surface on which the connection pads 122 are not formed) of the semiconductor chip 120, and fill at least portions of the cavity 110H. Since the encapsulant 130 fills the cavity 110H, depending on the type of material forming the encapsulant 130, the encapsulant 130 may serve as an adhesive and reduce buckling of the semiconductor chip 120 at the same time.

For example, the material of the encapsulant 130 may be, for example, thermosetting resin such as epoxy resin, thermoplastic resin such as polyimide, or resin in which the thermosetting resin or the thermoplastic resin is mixed with inorganic filler or impregnated together with inorganic filler in a core material such as glass fiber, but is not limited thereto. In some example embodiments, the material of the encapsulant 130 may be a curable resin, such as prepreg, ABF, FR-4, and BT, or a photosensitive insulating epoxy (PIE) resin.

The first redistribution layer 145 of the connection structure 140 may redistribute the connection pad 120P of the semiconductor chip 120. Connection pads 120P of several tens to several hundreds of semiconductor chips 120 having various functions may be redistributed by the connection structure 140, and through electrical connection metals 170, may be physically and/or electrically connected to an external component according to the functions.

The connection structure 140 includes insulating layers 141 disposed contiguous to the frame 110 and the semiconductor chip 120, redistribution patterns 142 disposed on the insulating layers 141, and redistribution vias 143 passing through the insulating layers 141 to connect the connection pad 120P and the redistribution patterns 142 to each other. Although in FIG. 9, the connection structure 140 is illustrated as including two insulating layers 141 and the first redistribution layer 145 having two levels, in other example embodiments, the first redistribution layer 145 may be implemented as a single level or three or more levels.

The insulating layers 141 may be formed using materials other than the aforementioned insulating materials, such as a photosensitive insulating material, e.g., PID resin. When the insulating layers 141 have photosensitive properties, the insulating layers 141 can be more thinly fabricated, thereby facilitating implementation of fine pitches of connection redistribution vias 143. In some example embodiments, each of the insulating layers 141 may be a photosensitive insulating layer including an insulating resin and an inorganic filler. If the insulating layers 141 are provided in multiple layers, they may be of a same material or of different materials from each other as needed. The insulating layers 141 provided in multiple layers may be processed such that boundaries between two adjacent insulating layers 141 are not apparent.

The first redistribution layer 145 may serve to substantially redistribute the connection pad 120P, and may be formed using at least one of the aforementioned conductive materials. The first redistribution layer 145 may serve various functions depending on the design of a corresponding layer. For example, the first redistribution layer 145 may include GRD patterns, PWR patterns, S patterns, or the like. The S patterns include various signals except for the GRD patterns and the PWR patterns, such as data signals, and may include pad patterns of various shapes as needed.

The redistribution vias 143 may electrically connect the redistribution patterns 142 and the connection pad 120P disposed on different layers, and the like, and may form an electrical path in a vertical (interlayer) direction within the semiconductor package 100. The redistribution vias 143 may be formed using at least one of the aforementioned conductive materials. The redistribution vias 143 may be completely filled with a conductive material, or may be formed of a conductive material formed along a wall of each of via holes. Each of the redistribution vias 143 of the connection structure 140 may have a tapered shape tapering in an opposite direction to that of the first and second wiring vias 113a and 113b. More specifically, each of the redistribution vias 143 may have a tapered cross-sectional shape of which a width at the first surface 140A is smaller than a width at the second surface 140B.

As described above, the second redistribution layer 155 may be disposed on the encapsulant 130 and connected to a wiring structure (the third wiring pattern 112c, in particular) of the frame 110. The redistribution vias 153 pass through at least portions of the encapsulant 130 to electrically connect the redistribution pattern 152 to the third wiring pattern 112c, which is an uppermost wiring pattern of the frame 110. The material forming the redistribution pattern 152 and the redistribution vias 153 also includes the aforementioned conductive materials, and may include a metal such as copper (Cu) in some example embodiments. Also, the redistribution pattern 152 and the redistribution vias 153 may be each a plurality of conductive layers including a seed layer and a conductive layer. The redistribution pattern 152 may serve various functions according to a design of a corresponding layer. For example, the redistribution pattern 152 may include GRD patterns, PWR patterns, S patterns, or the like. Each of the redistribution vias 153 may have a tapered shape tapering toward the frame 110 when viewed in cross-section.

The passivation layer 180 may serve to protect the second wiring layer 155 from external physical or chemical damage and the like. The passivation layer 180 may include at least one of the aforementioned insulating materials. In some example embodiments, the passivation layer 180 may include prepreg, ABF, FR-4, BT, solder resist, or PID. The passivation layer 180 may have a plurality of openings opening portions of the second redistribution layer 155.

The semiconductor package 100 may further include a plurality of underbump metal (UBM) layers 160 connected to a portion of the second redistribution layer 155 through the plurality of openings, and a plurality of electrical connection metals 170, each disposed on the plurality of UBM layers 160.

The UBM layer 160 may be formed in the openings of the passivation layer 180 by a metallization method known in the art using a conductive material known in the art, such as metal. However, the method of forming the UBM layer 160 is not limited thereto.

The number, interval, arrangement, or the like, of the electrical connection metals 170 are not particularly limited and can be variously modified by a person skilled in the art according to the particulars of a design of a corresponding layer. For example, the number of the electrical connection metals 170 may range from several tens to several thousands, depending on the number of the connection pads 122, or may be more or less than the above range.

The electrical connection metals 170 serve to physically and/or electrically connect the semiconductor package 100 to an external component, such as a mainboard of an electronic device. The electrical connection metals 170 may include solders of a low melting-point metal, such as tin (Sn)-aluminum (Al)-copper (Cu) solders. The electrical connection metals 170 may have a single layer or multiple layers. For example, the multiple layers may include copper pillars and solders, and the single layer may include a tin-silver solder or copper.

The electrical connection metals 170 are illustrated as having ball shapes, but may have other structures having a fixed length, such as lands or pins. Accordingly, a fixed amount of space can be secured for mounting components below the insulating layers 141 due to a length of the electrical connection metals 170.

At least one of the electrical connection metals 170 is disposed in a fan-out region. The fan-out region refers to a region outside a region overlapping the semiconductor chip 120. The fan-out package has superior reliability as compared to the fan-in package, can implement a plurality of I/O terminals, and can conveniently implement 3D interconnection. Also, compared to packages such as a ball grid array (BGA) package and a land grid array (LGA) package, the fan-out package can be fabricated with a smaller thickness and can have a more competitive price.

In some example embodiments, a metal layer may be additionally formed on a wall of a cavity 110H for the purposes of dissipating heat and shielding electromagnetic waves. Although not illustrated in FIG. 9, other semiconductor chips serving a same function or different functions from each other may be additionally disposed in the cavity 110H. In some example embodiments, there may be a plurality of cavities 110H, and a semiconductor chip 120 and/or surface-mount components may be disposed in each of the plurality of cavities 110H. The surface-mount components may include a passive component such as an inductor and a capacitor. As described above, the area for placing the heat dissipation element 195 can be adjusted so as to secure more space for the surface-mount components (see FIG. 12 and FIG. 14).

FIG. 11A to FIG. 11D are cross-sectional views illustrating processes of a manufacturing method of a semiconductor package according to an example embodiment.

Figure 11A:
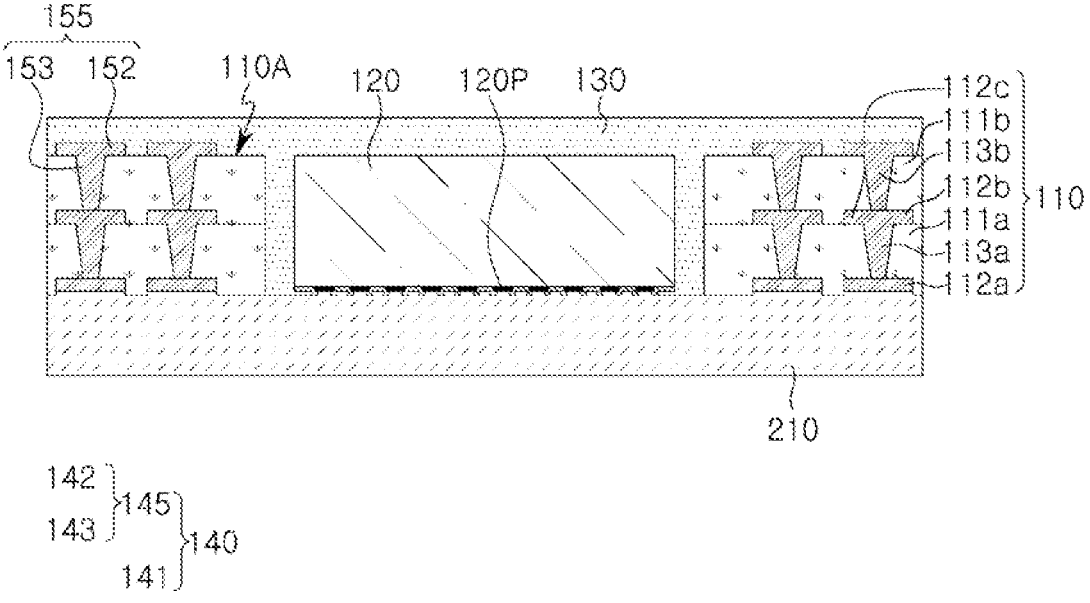
FIG. 11A through FIG. 11D are cross-sectional views illustrating processes of a method of manufacturing a semiconductor package according to an example embodiment.

Referring to FIG. 11A, a semiconductor chip 120 and a frame 110 having a cavity 110H accommodating the semiconductor chip 120 therein are disposed on a first adhesive film 210, and then an encapsulant 130 is formed to encapsulate the semiconductor chip 120.

As described above, the frame 110 employed in the present example embodiment includes a wiring structure in addition to first and second insulating layers 111a and 111b. The wiring structure includes wiring patterns 112a, 112b, and 112c, and wiring vias 113a and 113b connecting the wiring patterns 112a, 112b, and 112c to each other. The first adhesive film 210 is attached to a lower surface of the first insulating layer 111a. For example, the first adhesive film 210 may be a tape containing epoxy resin, or the like. The semiconductor chip 120 is mounted in the cavity 110H of the frame 110, and then the encapsulant 130 can be formed to encapsulate the semiconductor chip 120 by using a suitable encapsulating material. The encapsulant 130 may extend onto an upper surface of the frame 110 and cover the third wiring pattern 112c.

Figure 11B:
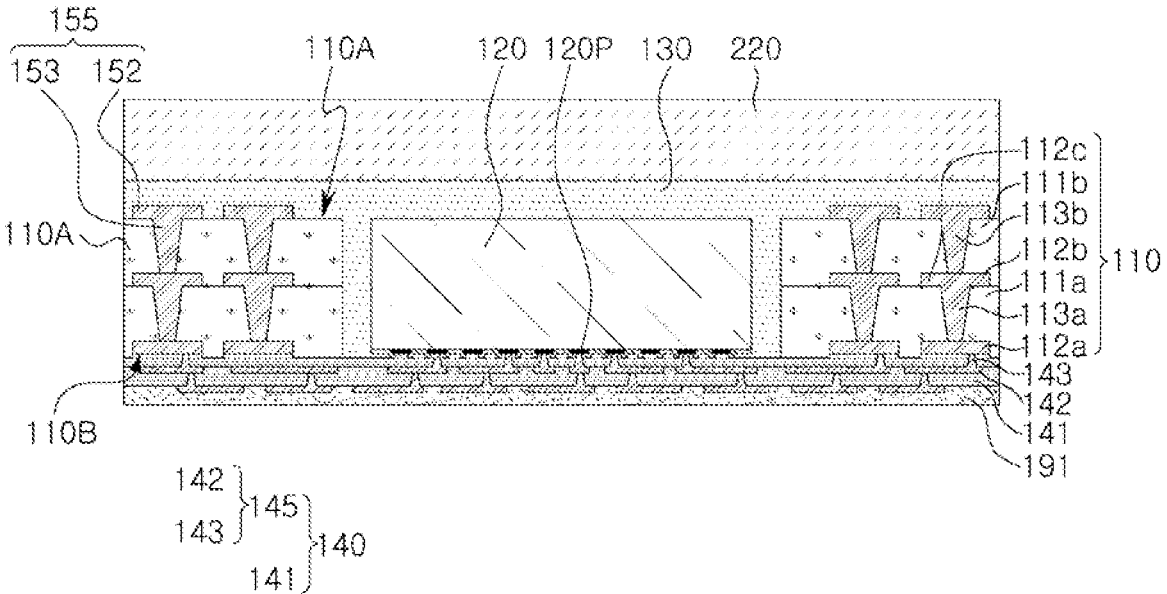

Next, referring to FIG. 11B, a second adhesive film 220 is attached to an upper surface of the encapsulant 130, and after removing the first adhesive film 210, a connection structure 140 is formed on a surface from which the first adhesive film 210 has been removed.

More specifically, the connection structure 140 may be formed by a method, the method in which an insulating layer 141 is formed using a lamination or coating method, thereafter a via hole is formed in the insulating layer 141, and then a first redistribution layer 142 and vias 143 are formed by electrolytic plating or electroless plating. When using a PID resin for the insulating layer 141, the via holes can be formed by photolithography to achieve fine pitches.

Figure 11C:
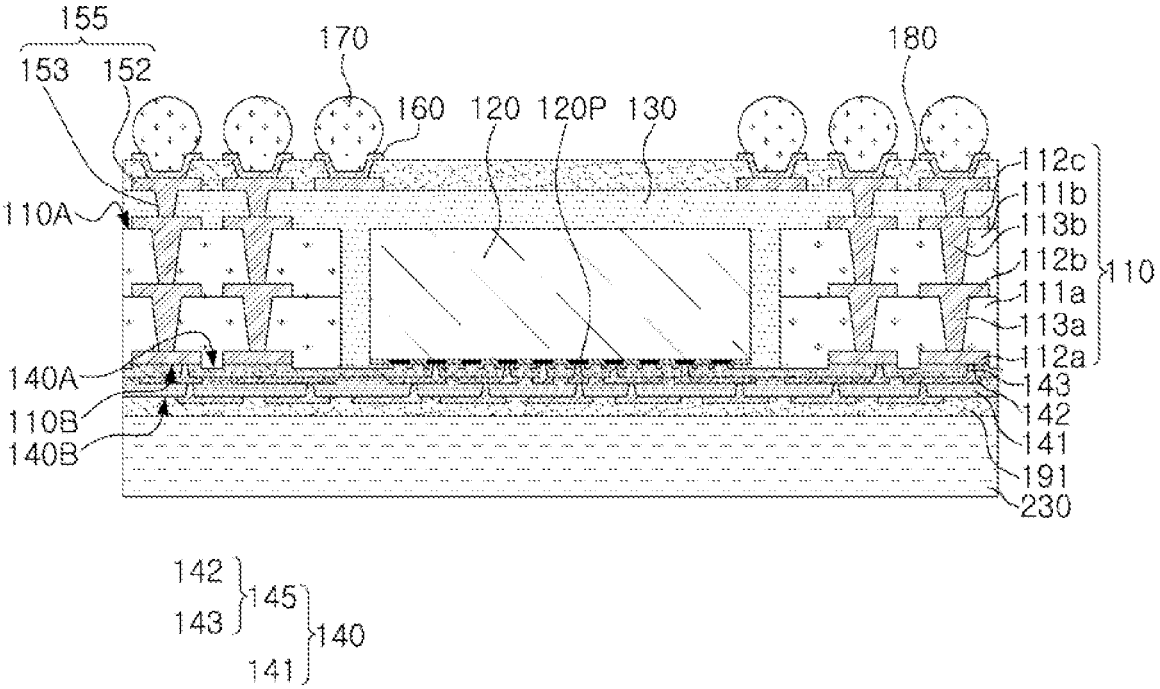

Next, referring to FIG. 11C, a third adhesive film 230 is attached to a second surface 140B of the connection structure 140. After removing the second adhesive film 220, a second redistribution layer 155, a passivation layer 180, and an UBM layer 160 are formed on a surface from which the second adhesive film 220 has been removed.

More specifically, the second redistribution layer 155, which is connected to the wiring structure, is formed on the encapsulant 130, and the second redistribution layer 155 includes redistribution vias 153 and a redistribution pattern 152. The passivation layer 180 is formed on the encapsulant 130 so as to cover the second redistribution layer 155, and a plurality of openings are formed in the passivation layer 180, thereby exposing portions of the redistribution pattern 152. The UBM layer 160 is formed on the passivation layer 180 such that the UBM layer 160 is connected to the redistribution pattern 152 through the plurality of openings. Next, electrical connection metals 170 may be then formed on the UBM layer 160. Alternatively, a process of forming the electrical connection metals 170 may be performed in a subsequent process following a process of attaching a heat dissipation element 185.

Figure 11D:
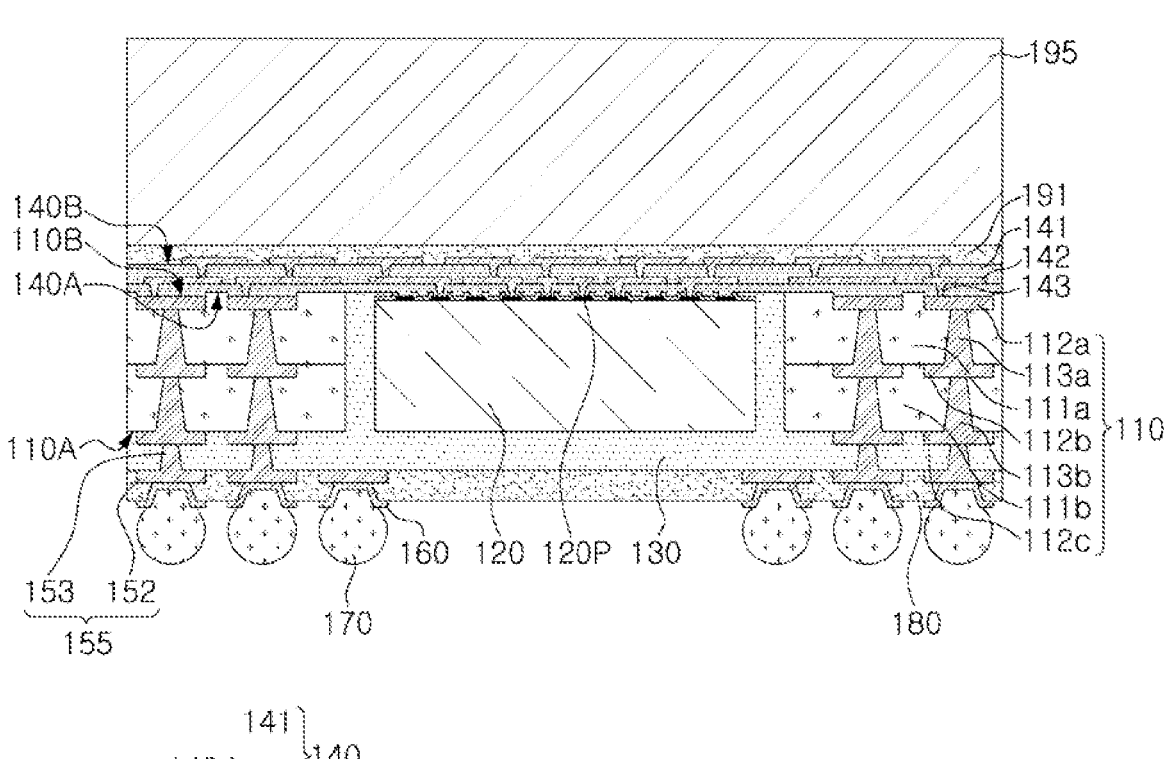

Next, referring to FIG. 11D, the third adhesive film 230 is removed from the connection structure 140, and the heat dissipation element 185 is formed on a surface from which the third adhesive film 230 has been removed.

After removing the third adhesive film 230, the heat dissipation element 195 is attached to the upper surface of the encapsulant 130 by using an adhesive layer 191. The adhesive layer 191 may include a thermal interface material (TIM). Accordingly, as the active surface of the semiconductor chip 120 is disposed in proximity to the heat dissipation element 195 with a relatively thin connection structure 140 disposed therebetween, heat dissipating effects can be dramatically improved.

Meanwhile, a series of processes described above can be performed at a panel level, and through modification of a dicing process, a plurality of semiconductor packages 100 can be produced in a single process.

The heat dissipation system employed in the present example embodiment can be variously modified and implemented. For example, the area on which the heat dissipation element is formed may be variously modified.

Figure 12:
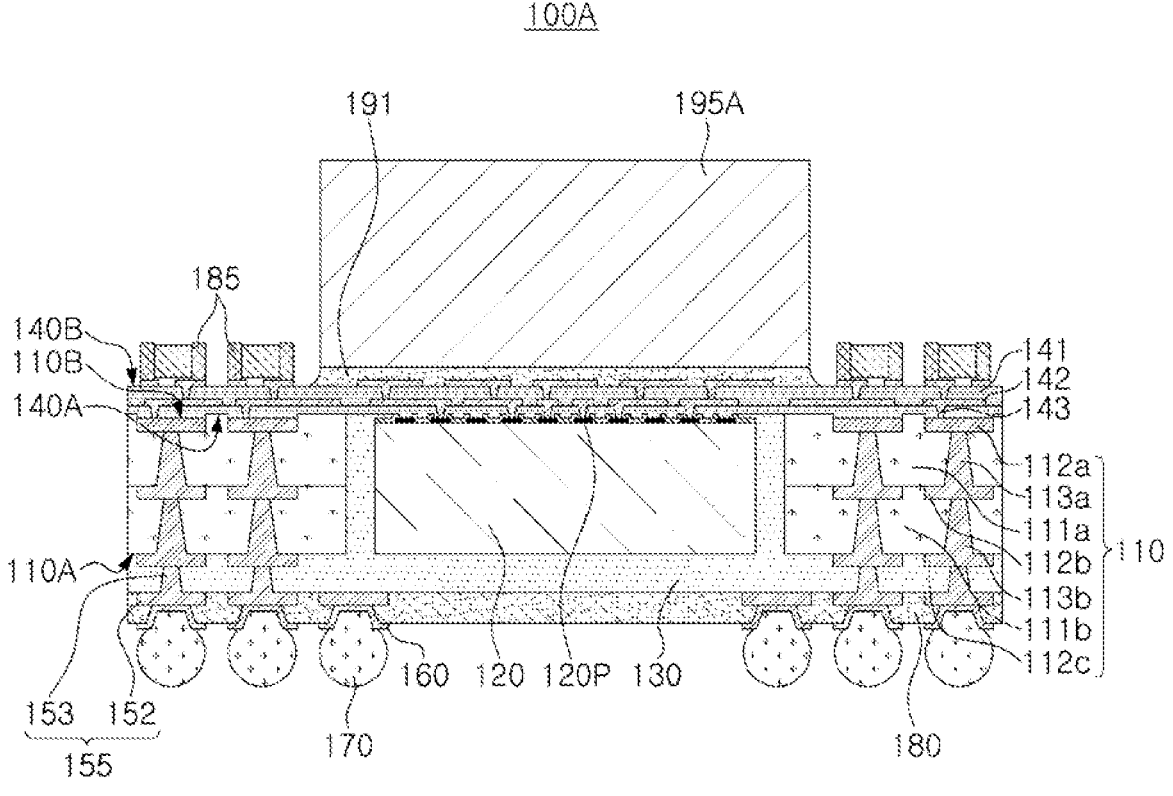
FIG. 12 is a schematic cross-sectional view illustrating a semiconductor package according to an example embodiment.
Figure 13:
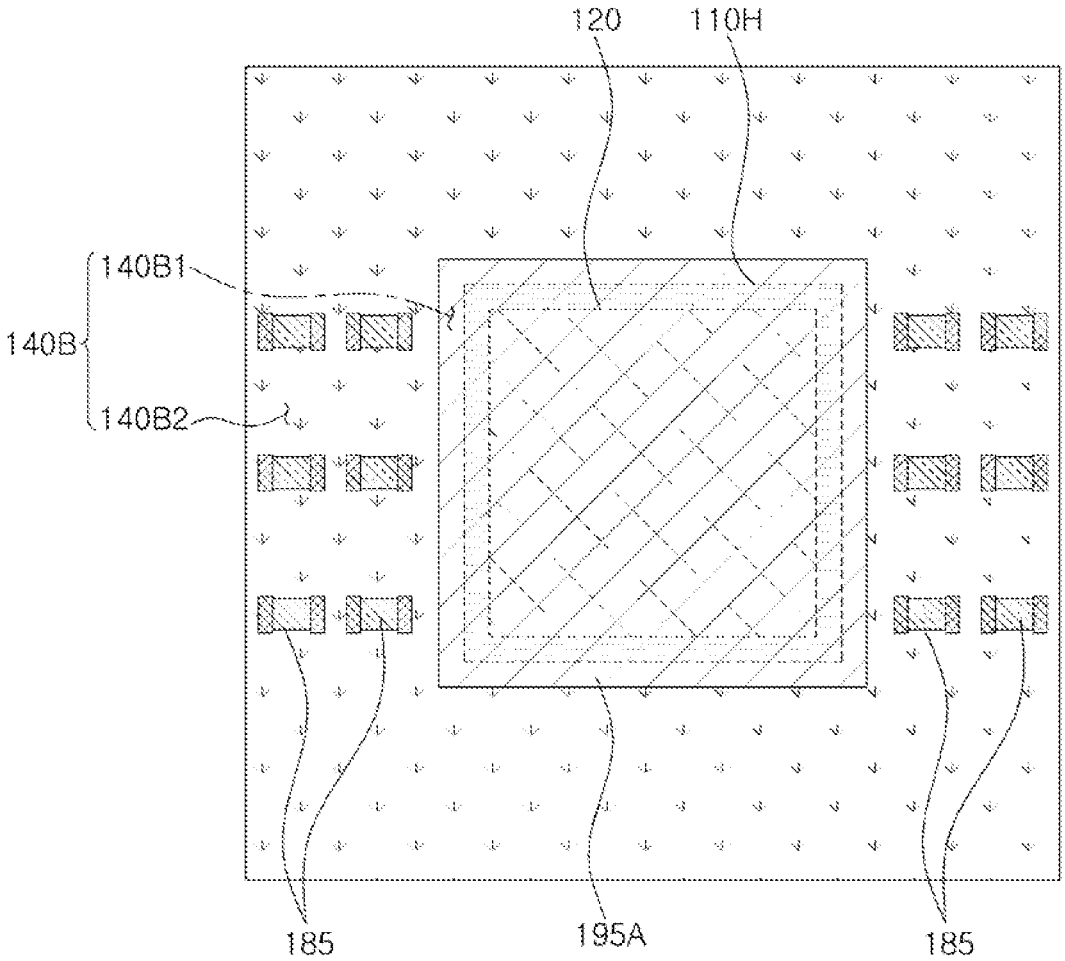
FIG. 13 is a plan view illustrating the semiconductor package of FIG. 12.

FIG. 12 is a schematic cross-sectional view illustrating a semiconductor package according to an example embodiment, and FIG. 13 is a plan view of the semiconductor package of FIG. 12.

Referring to FIG. 12 and FIG. 13, a semiconductor package 100A according to the present example embodiment can be understood as being similar to the structure illustrated in FIG. 9 and FIG. 10, except that a heat dissipation element 195 is formed only on an inner region of the second surface 140B of the connection structure 140 and that surface-mount components 185 are disposed on an outer region of the second surface 140B of the connection structure 140. Components in the present example embodiment, unless otherwise stated, can be better understood by referring to the descriptions of identical or similar components described with reference to the semiconductor package 100 illustrated in FIG. 9 and FIG. 10.

In the present example embodiment, the second surface 140B of the connection structure 140 may be divided into a first region 140B1 and a second region 140B2 surrounding the first region 140B1, and a heat dissipation element 195A may be disposed on the second region 140B2 such that the first region 140B1 of the connection structure 140 remains exposed. The first region 140B1 on which the heat dissipation element 195A is disposed overlaps the semiconductor chip 120, and thus serves as an efficient heat dissipation path. According to the present example embodiment, the region on which the heat dissipation element 195A is disposed, the first region 140B1, may have a sufficient surface area covering a region overlapping the semiconductor chip 120.

The plurality of surface-mount components 185 may be disposed on the first region 140B1 of the connection structure 140 and electrically connected to the first redistribution layer 145. For example, the surface-mount components 185 may include a passive component, such as an inductor and a capacitor. As described in the present example embodiment, the surface-mount components 185 can be positioned utilizing a region adjacent to corners of the connection structure 140 on which the heat dissipation element 195A is formed, the first region 140B1.

Figure 14:
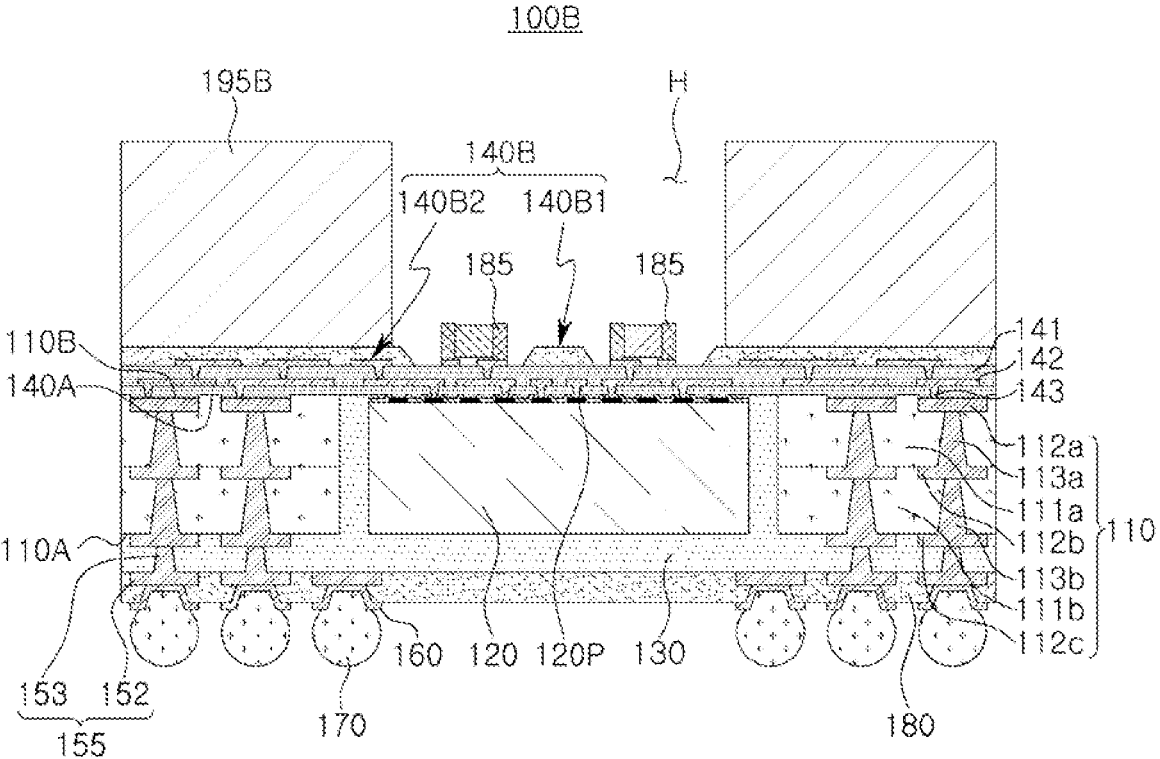
FIG. 14 is a schematic cross-sectional view illustrating a semiconductor package according to an example embodiment.
Figure 15:
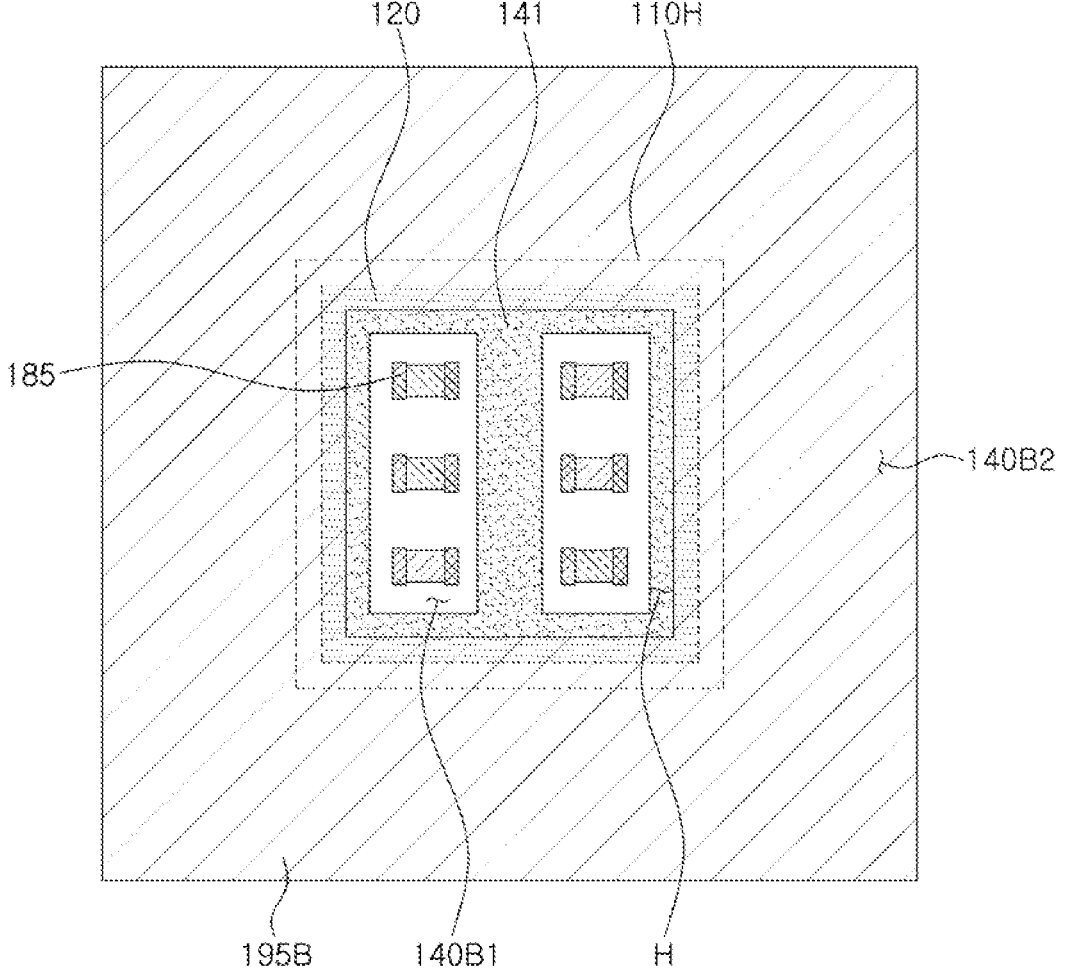
FIG. 15 is a plan view illustrating the semiconductor package of FIG. 14.

FIG. 14 is a schematic cross-sectional view illustrating a semiconductor package according to an example embodiment of the present disclosure, and FIG. 15 is a plan view of the semiconductor package of FIG. 14.

Referring to FIG. 14 and FIG. 15, a semiconductor package 100B according to the present example embodiment can be understood as being similar to the structure illustrated in FIG. 9 and FIG. 10, except that a heat dissipation element 195 has a through-hole H opening the inner region of the second surface 140B of the connection structure 140, and that the surface-mount components 185 are disposed on the inner region of the second surface 140B of the connection structure 140. Components in the present example embodiment, unless otherwise stated, can be better understood by referring to the descriptions of identical or similar components described with reference to the semiconductor package 100 illustrated in FIG. 9 and FIG. 10.

In the present example embodiment, a heat dissipation element 195B may have a structure having the through-hole H. The second surface 140B of the connection structure 140 may be divided into a first region 140B1 and a second region 140B2 surrounding the first region 140B1, and the heat dissipation element 195 may be disposed on the second surface 140B of the connection structure 140, such that the second region 140B2 of the connection structure 140 is exposed through the through-hole H of the heat dissipation element 195B. For heat dissipation efficiency, the second region 140B2 on which the heat dissipation element 195B is disposed may be disposed to overlap at least a portion of the semiconductor chip 120.

A plurality of surface-mount components 185 may be disposed on the second region 140B2 of the connection structure 140 and electrically connected to the first redistribution layer 145. In the present example embodiment, the heat dissipation element 195B, due to having a smaller area overlapping the semiconductor chip 120 as compared to the previous example embodiments, may have reduced heat dissipation performance; however, since the surface-mount components 185 are disposed on the first region 140B1, the region adjacent to corners of the connection structure 140 in which the heat dissipation element 195B is disposed, a component mounting process can be more conveniently accommodated.

Figure 16:
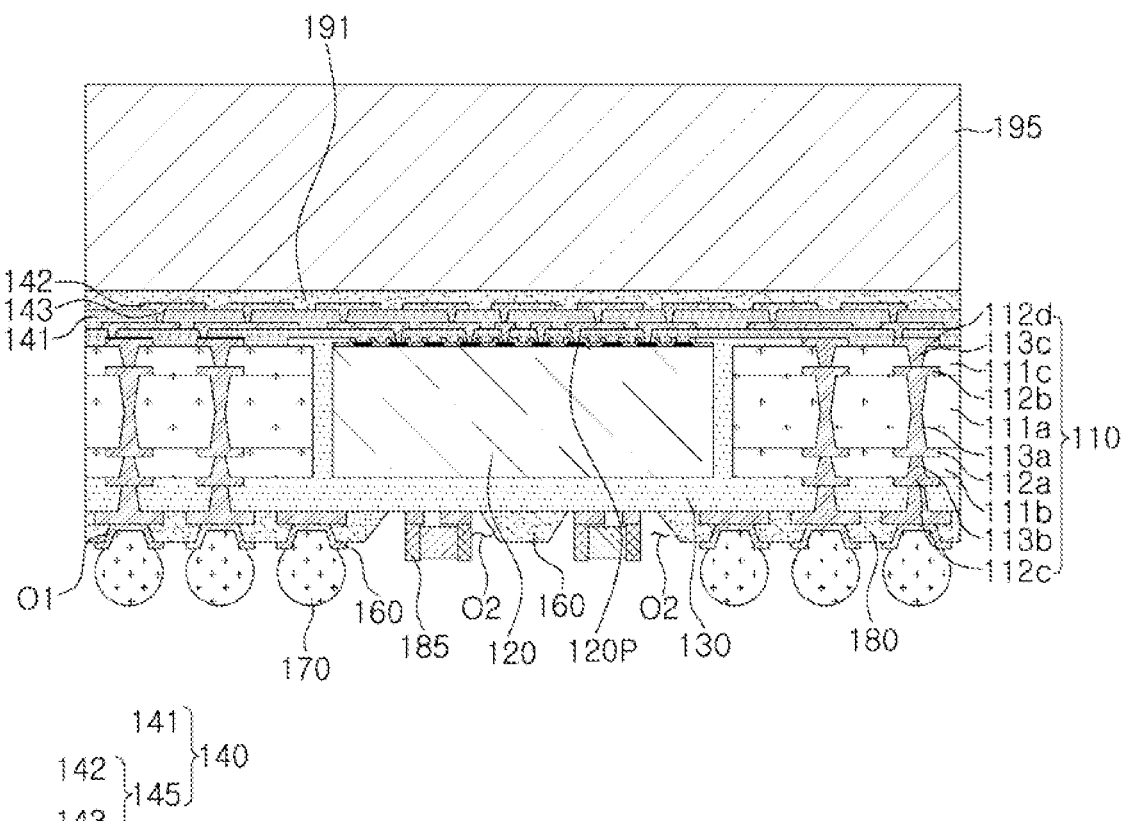
FIG. 16 is a schematic cross-sectional view illustrating a semiconductor package according to an example embodiment.

FIG. 16 is a schematic cross-sectional view of a semiconductor package according to an example embodiment of the present disclosure.

Referring to FIG. 16, a semiconductor package 100C according to the present example embodiment can be understood as being similar to the structure illustrated in FIG. 9 and FIG. 10, except that surface-mount components 185 are disposed on a second wiring layer 155 and that a frame 110 has a different wiring structure. Components in the present example embodiment, unless otherwise stated, can be better understood by referring to the descriptions of identical or similar components described with reference to the semiconductor package 100 illustrated in FIG. 9 and FIG. 10.

Referring to FIG. 16, a plurality of surface-mount components 185 may be disposed on a region overlapping the semiconductor chip 120 and connected to the second redistribution layer 155. In the present example embodiment, second openings O2 for the surface-mount components 185 may be formed in a passivation layer 180 in addition to first openings O1 for an UBM layer 160, and the plurality of surface-mount components 185 may be disposed thereon so as to be connected to a second redistribution pattern 152 exposed through the second openings O2. Although a plurality of the surface-mount components 185 are illustrated as being provided in the present example embodiment as well as in the other example embodiments described above, it may be a single surface-mount component being disposed if needed.

The frame 110 employed in the present example embodiment may have a modified structure, and a wiring structure therein may be modified accordingly. More specifically, the frame 110 includes: a first insulating layer 111a; a first wiring pattern 112a disposed on one surface of the first insulating layer 111a; a second wiring pattern 112b disposed on the other surface of the first insulating layer 111a; a second insulating layer 111b disposed on the one surface of the first insulating layer 111a and covering at least portions of the first wiring pattern 112a; a third wiring pattern 112c disposed on the other surface of the second insulating layer 111b opposing one surface of the second insulating layer 111b in which the first wiring layer 112a is buried; a third insulating layer 111c disposed on the other surface of the first insulating layer 111a and covering at least portions of the second wiring pattern 112b; a fourth wiring pattern 112d disposed on the other surface of the third insulating layer 111c opposing one surface of the third insulating layer 111c in which the second wiring pattern 112b is buried; a first wiring via 113a passing through the first insulating layer 111a to electrically connect the first and second wiring patterns 112a and 112b to each other; a second wiring via 113*b* passing through the second insulating layer 111*b* to electrically connect the first and third wiring patterns 112*a* and 112*c* to each other; and a third wiring via 113*c* passing through the third insulating layer 111*c* to electrically connect the second and fourth wiring patterns 112*b* and 112*d* to each other. Accordingly, the frame 110 employed in the present example embodiment accommodates a relatively greater number of wiring patterns 112*a*, 112*b*, 112*c*, and 112*d*, and thus can further simplify the redistribution layer 152 of the connection structure 140.

The first insulating layer 111*a* may have a greater thickness than a thickness of each of the second insulating layer 111*b* and the third insulating layer 111*c*. The first insulating layer 111*a* may be relatively thicker to maintain a basic rigidity, and the second insulating layer 111*b* and the third insulating layer 111*c* may be incorporated to accommodate a greater number of wiring patterns 112*c* and 112*d*. The first insulating layer 111*a* may contain a different insulating material than the second insulating layer 111*b* or the third insulating layer 111*c*. For example, the first insulating layer 111*a* may be, for example, a prepreg containing a core material such as glass fiber, an inorganic filler, and an insulating resin, while each of the second insulating layer 111*c* and the third insulating layer 111*c* may be a PID resin or ABF containing an inorganic filler and an insulating resin. However, the first insulating layer 111*a*, the second insulating layer 111*c*, and the third insulating layer 111*c* are not limited thereto. Similarly, the first wiring via 113*a* passing through the first insulating layer 111*a* may have a larger diameter than a diameter of each of the second and third wiring vias 113*b* and 113*c* passing through the second and third insulating layers 111*b* and 111*c*, respectively. In addition, the first wiring via 113*a* may have a shape similar to an hourglass or a cylinder, and the second and third wiring vias 113*b* and 113*c* may have shapes tapering in opposite directions from each other. The first to fourth wiring patterns 112*a*, 112*b*, 112*c*, and 112*d* may each have a thickness greater than a thickness of the first redistribution layer 142 of the connection structure 140.

According to example embodiments disclosed herein, there may be provided a semiconductor package having dramatically improved heat dissipation characteristics by having a heat dissipation element disposed adjacent to an active surface of a semiconductor chip.

The terms "lower side," "lower portion," "lower surface," and the like, are used herein to refer to a downward direction in relation to cross sections of the drawings for convenience, while the terms "upper side," "upper portion," "upper surface," and the like, are used herein to refer to an opposite direction to the downward direction. However, these directions are defined for convenience of description and the claims are not particularly limited by the directions defined as described above, and concepts of upper and lower portions may be exchanged with each other.

Throughout the specification, a statement that an element is "connected to" or "coupled to" another element, it includes a case in which the element is indirectly connected or coupled to the other element through an adhesive layer or the like, as well as a case in which the element is directly connected or coupled to the other element. Also, when an element is "electrically connected" to another element, the element may or may not be in physical connection with the other element. Also, the terms "first," "second," and any variation thereof used herein, do not denote any order or importance of the elements, but are used for the purpose of distinguishing one element from another. For example, a first element could be termed as a second element, and similarly, a second element could be termed as a first element, without departing from the scope of the present disclosure.

The term "an example embodiment" used herein does not refer to the same example embodiment, and is provided to emphasize a particular feature of characteristic different from that of another example embodiment. However, example embodiments described herein can be implemented by being combined in whole or in part with one another. For example, For example, one element described in a particular example embodiment, even if it is not described in another example embodiment, may be understood as a description related to another example embodiment unless an opposite or contradictory description is provided therein.

Terms used employed in the present herein are used only to illustrate example embodiments rather than limiting the scope of the present disclosure. Furthermore, the use of the singular includes the plural unless specifically stated otherwise.

What is claimed is:

1. A semiconductor package, comprising:
a connection structure having first and second surfaces opposing each other and including an insulating layer and a first redistribution layer on the insulating layer;
a semiconductor chip disposed on the first surface of the connection structure and including connection pads connected to the first redistribution layer;
an encapsulant disposed on the first surface of the connection structure and encapsulating the semiconductor chip; a second redistribution layer disposed on the encapsulant;
a wiring structure connecting the first and second redistribution layers to each other and extending in a stacking direction; and
a heat dissipation element disposed on at least a portion of the second surface of the connection structure,
wherein the second surface of the connection structure includes a first region overlapping the semiconductor chip in the stacking direction and a second region, and the heat dissipation element is disposed on the first region to expose the second region of the connection structure.

2. The semiconductor package of claim 1, further comprising at least one surface-mount component connected to the second redistribution layer and disposed on the second region.

3. The semiconductor package of claim 1, further comprising an adhesive layer attaching the heat dissipation element to the connection structure.

4. The semiconductor package of claim 3, wherein the adhesive layer includes a thermal interface material (TIM).

5. The semiconductor package of claim 1, further comprising: a passivation layer disposed on the encapsulant and covering the second redistribution layer; and a plurality of underbump metal layers on the passivation layer and connected to the second redistribution layer.

6. The semiconductor package of claim 5, wherein the passivation layer includes a plurality of openings exposing portions of the second redistribution layer, and the plurality of underbump metal layers are connected to the portions of the second redistribution layer through the plurality of openings.

7. The semiconductor package of claim 5, further comprising a plurality of electrical connection metals, respectively disposed on the plurality of underbump metal layers.

8. A semiconductor package, comprising:

a connection structure having first and second surfaces opposing each other and including a first redistribution layer, the second surface divided into a first region and a second region;

a semiconductor chip disposed on the first surface of the connection structure and including connection pads connected to the first redistribution layer;

an encapsulant disposed on the first surface of the connection structure and encapsulating the semiconductor chip;

a second redistribution layer disposed on the encapsulant;

a wiring structure connecting the first and second redistribution layers to each other and extending in a stacking direction; and a heat dissipation element disposed on the first region of the second surface of the connection structure;

an adhesive layer attaching the heat dissipation element to the connection structure; and at least one surface-mount component disposed on the second region of the connection structure and connected to the first redistribution layer.

9. The semiconductor package of claim 8, wherein the first region includes a region overlapping the semiconductor chip in the stacking direction, and the second region surrounds the first region.

10. The semiconductor package of claim 8, wherein the adhesive layer includes a thermal interface material (TIM).

11. The semiconductor package of claim 8, further comprising a frame disposed on the first surface of the connection structure and having a through-hole accommodating the semiconductor chip therein, wherein the wiring structure passes through the frame.

12. The semiconductor package of claim 11, wherein the encapsulant includes an extended portion covering an upper surface of the frame opposing the first surface of the connection structure.

13. The semiconductor package of claim 12, wherein the second redistribution layer includes a second redistribution pattern disposed on the encapsulant, and a second redistribution via penetrating through the extended portion and connected to the second redistribution pattern.

14. The semiconductor package of claim 11, wherein the frame includes a first insulating layer and a second insulating layer sequentially stacked one on top of another, wherein the wiring structure includes:

a first wiring pattern disposed in the first insulating layer and connected to the connection structure;

a second wiring pattern disposed on one surface of the first insulating layer which is an opposite side to a side where the first wiring pattern is disposed;

a third wiring pattern disposed on one surface of the second insulating layer which is an opposite side to a side where the second wiring pattern is disposed;

a first wiring via passing through the first insulating layer to connect the first and second wiring patterns to each other; and a second wiring via passing through the second insulating layer to connect the second and third wiring patterns to each other.

15. The semiconductor package of claim 11, wherein the frame includes a first insulating layer, a second insulating layer disposed on one surface of the first insulating layer, and a third insulating layer disposed on another surface of the first insulating layer, and wherein the wiring structure includes:

a first wiring pattern disposed on the one surface of the first insulating layer;

a second wiring pattern disposed on the another surface of the first insulating layer;

a third wiring pattern disposed on the second insulating layer;

a fourth wiring pattern disposed on the third insulating layer;

a first wiring via passing through the first insulating layer to connect the first and second wiring patterns to each other;

a second wiring via passing through the second insulating layer to connect the first and third wiring patterns to each other; and a third wiring via passing through the third insulating layer to connect the second and fourth wiring patterns to each other.

16. The semiconductor package of claim 8, further comprising: a passivation layer disposed on the encapsulant and covering the second redistribution layer; and a plurality of underbump metal layers disposed on the passivation layer and connected to the second redistribution layer.

17. The semiconductor package of claim 16, wherein the passivation layer includes a plurality of openings exposing portions of the second redistribution layer, and the plurality of underbump metal layers are connected to the portions of the second redistribution layer through the plurality of openings.

18. The semiconductor package of claim 16, further comprising a plurality of electrical connection metals, respectively disposed on the plurality of underbump metal layers.

19. A semiconductor package, comprising:

a connection structure having first and second surfaces opposing each other and including an insulating layer and a first redistribution layer on the insulating layer;

a semiconductor chip disposed on the connection structure and having an active surface facing the first surface of the connection structure, and connection pads arranged on the active surface, the connection pads connected to the first redistribution layer;

an encapsulant disposed on the first surface of the connection structure and encapsulating the semiconductor chip;

a second redistribution layer disposed on the encapsulant;

a wiring structure connecting the first and second redistribution layers to each other and extending in a stacking direction;

a heat dissipation element disposed on an entire area of the second surface of the connection structure;

an adhesive layer attaching the heat dissipation element to the insulating layer of the connection structure;

a passivation layer disposed on the encapsulant and covering the second redistribution layer; and a plurality of underbump metal layers disposed on the passivation layer and connected to the second redistribution layer.

20. The semiconductor package of claim 19, further comprising at least one surface-mount component disposed on the passivation layer in a region overlapping the semiconductor chip from a viewpoint parallel to the stacking direction, the at least one surface-mount component being connected to the second redistribution layer.

* * * * *